United States Patent
Jeong

(10) Patent No.: US 7,560,202 B2
(45) Date of Patent: Jul. 14, 2009

(54) METHOD FOR MANUFACTURING IMAGE SENSOR

(75) Inventor: Seong Hee Jeong, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 393 days.

(21) Appl. No.: 11/614,103

(22) Filed: Dec. 21, 2006

(65) Prior Publication Data

US 2007/0148976 A1    Jun. 28, 2007

(30) Foreign Application Priority Data

Dec. 28, 2005    (KR)    .................. 10-2005-0132006

(51) Int. Cl.
*G02B 5/20*    (2006.01)
(52) U.S. Cl. .................. 430/7; 430/321; 430/329
(58) Field of Classification Search .................. None
See application file for complete search history.

(56) References Cited

U.S. PATENT DOCUMENTS 5,059,500 A * 10/1991 Needham et al. .............. 430/7
5,756,239 A * 5/1998 Wake .............................. 430/7
6,582,988 B1 * 6/2003 Hsiao et al. .................... 438/70
2001/0046043 A1 * 11/2001 Johnson et al. ............... 356/72
2006/0046341 A1 * 3/2006 Joon ........................... 438/70

FOREIGN PATENT DOCUMENTS

| JP | 05-214501 | | 3/1995 |
| JP | 2004-063522 A | * | 2/2004 |
| KR | 10-2004-0066697 | | 7/2005 |

OTHER PUBLICATIONS

Computer-generated translation of Jp 2004-063522 (Feb. 2004).*

* cited by examiner

*Primary Examiner*—John A. McPherson
(74) *Attorney, Agent, or Firm*—Saliwanchik, Lloyd & Saliwanchik

(57) ABSTRACT

A method for manufacturing an image sensor is provided. The method includes forming a metal pad on a pad region of a semiconductor substrate having an active region and the pad region, forming a metal pad opening by forming a passivation layer on an entire surface of the semiconductor substrate including the metal pad and selectively removing the passivation layer to expose the metal pad, forming a color filter array on the passivation layer of the active region by removing a photosensitive layer used for forming the color filter array through an ashing process using an end point detection method, and forming a microlens on the color filter layer.

20 Claims, 3 Drawing Sheets

METHOD FOR MANUFACTURING IMAGE SENSOR

RELATED APPLICATION(S)

This application claims priority under 35 U.S.C. §119(e) of Korean Patent Application No. 10-2005-0132006 filed Dec. 28, 2005, which is incorporated herein by reference in its entirety.

FIELD OF THE INVENTION

The present invention relates to a method for manufacturing an image sensor.

BACKGROUND OF THE INVENTION

An image sensor is a semiconductor device for converting an optical image into an electric signal, which is generally classified as a charge coupled device (CCD) or a complementary metal oxide semiconductor (CMOS) image sensor.

The CCD has several disadvantages such as a complicated driving mode, a high power consumption and a complicated fabricating process due to the number of multi-step photo processes. Also, the CCD has another disadvantage in that it is difficult to integrate a control circuit, a signal processing circuit and an analog-to-digital (A/D) converter circuit into a single chip.

Therefore, in recent years, the CMOS image sensor has received attention as a next-generation image sensor to overcome the shortcomings of the CCD.

The CMOS image sensor is a device employing a switching mode that sequentially detects outputs of each unit pixel using MOS transistors using a control circuit and a signal processing circuit as peripheral circuits. The MOS transistors are formed using a CMOS technology in each unit pixel. The CMOS image sensor has advantageous merits such as low power consumption and simplified fabrication process due to the relatively small number of photo processing steps. In addition, since it is possible to integrate a control circuit, a signal processing circuit and an A/D converter circuit, into a CMOS chip, the CMOS image sensor is easy to use in compact products.

FIG. 1 is a cross sectional view of an image sensor according to a related art.

Referring to FIG. 1, an image sensor includes a metal pad 4 formed on a semiconductor substrate 2, a metal pad opening 6 exposing the metal pad 4, a first planarization layer 8, a color filter array 10, a second planarization layer 12 and a microlens 14.

The color filter array 10 for realizing a color image may consist of three colors such as red, green and blue or yellow, magenta and cyan.

However, in a manufacturing process of an image sensor according to the related art, because a photosensitive layer used for forming each color filter is removed by etching for a predetermined time, the photosensitive layer is not always completely removed from the metal pad opening, which causes the metal pad to be contaminated with the remaining photosensitive layer.

The photosensitive layer is also not completely removed but remains on the respective color filters so that cross sections of the color filters may not be planarized. As a result, a gap may occur between color filters, causing an undesirable light beam to flow into a photodiode.

BRIEF SUMMARY

Accordingly, embodiments of the present invention are directed to a method for manufacturing an image sensor that substantially obviates one or more problems due to limitations and disadvantages of the related art.

An object of embodiments of the present invention is to provide a method for completely removing a photosensitive layer used for forming a color filter array from a metal pad.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for manufacturing an image sensor, the method including: forming a metal pad on a pad region of a semiconductor substrate having an active region and the pad region; forming a metal pad opening by forming a passivation layer on an entire surface of the semiconductor substrate including the metal pad and selectively removing the passivation layer to expose the metal pad; forming a color filter array on the passivation layer of the active region by removing a photosensitive layer used for forming the color filter array through an ashing process using an end point detection method; and forming a microlens on the color filter layer.

In another embodiment of the present invention, there is provided a method for manufacturing an image sensor, the method including: forming a metal pad on a pad region of a semiconductor substrate having an active region and the pad region; forming a metal pad opening by forming a passivation layer on an entire surface of the semiconductor substrate including the metal pad and selectively removing the passivation layer to expose the metal pad; forming a first planarization layer on an entire surface of the passivation layer; forming a color filter array on the passivation layer of the active region by removing a photosensitive layer used for forming the color filter array through an ashing process using an end point detection method; removing the first planarization layer on the pad region; and forming a microlens on the color filter layer.

In a further embodiment of the present invention, there is provided a method for manufacturing an image sensor, the method including: forming a metal pad on a pad region of a semiconductor substrate having an active region and the pad region; forming a metal pad opening by forming a passivation layer on an entire surface of the semiconductor substrate including the metal pad and selectively removing the passivation layer to expose the metal pad; forming a first planarization layer on an entire surface of the passivation layer; forming a color filter array on the passivation layer of the active region by removing a photosensitive layer used for forming the color filter array through an ashing process using an end point detection method; forming a second planarization layer on an entire surface of the semiconductor substrate including the color filter array; removing the first and second planarization layers on the pad region; and forming a microlens on the color filter layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2H are cross sectional views illustrating a method for manufacturing an image sensor according to an embodiment of the present invention.

Figure 1:
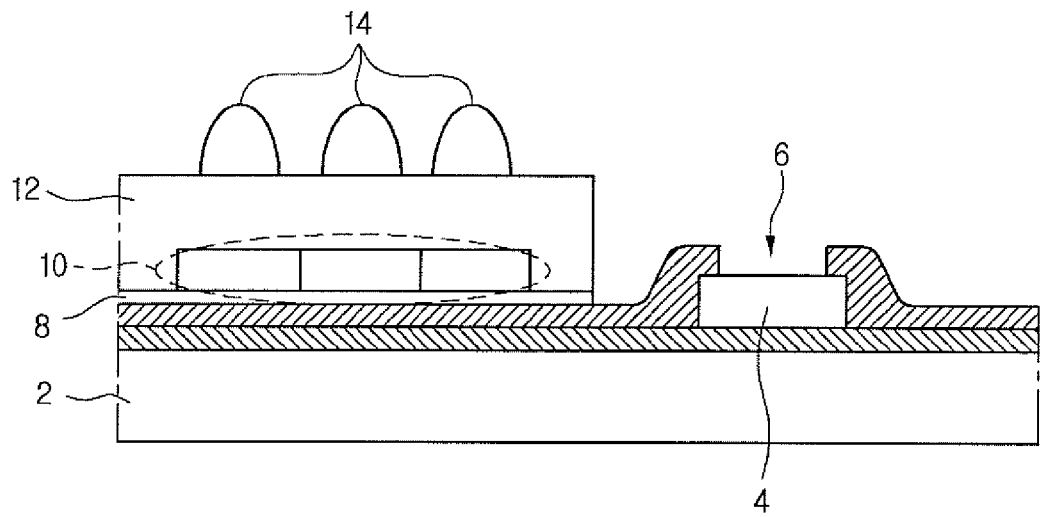
FIG. 1 is a cross sectional view of an image sensor according to a related art.
Figure 2A:
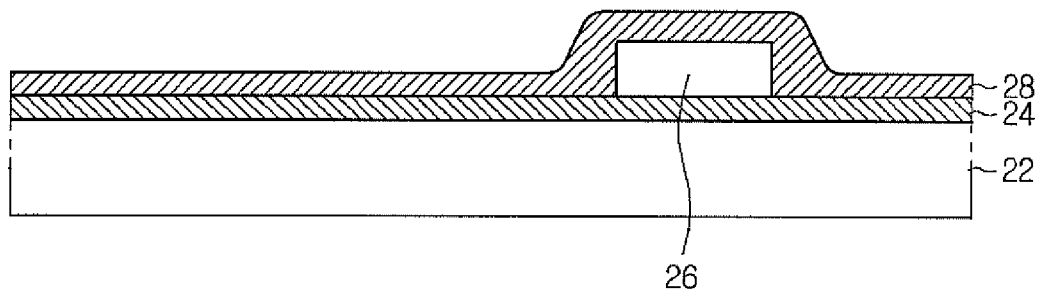
FIGS. 2A to 2H are cross sectional views illustrating a method for manufacturing an image sensor according to an embodiment of the present invention.

Referring to FIG. 2A, an insulating layer 24 such as an oxide layer can be formed on a semiconductor substrate 22 having an active region and a pad region, and a metal pad 26 for each signal line can be formed on the pad region. In one embodiment the metal pad 26 may be formed of aluminum.

A passivation layer 28 can be formed on the insulating layer 24 including the metal pad 26. In one embodiment, passivation layer 28 can be formed of an oxide, or a nitride.

Figure 2B:
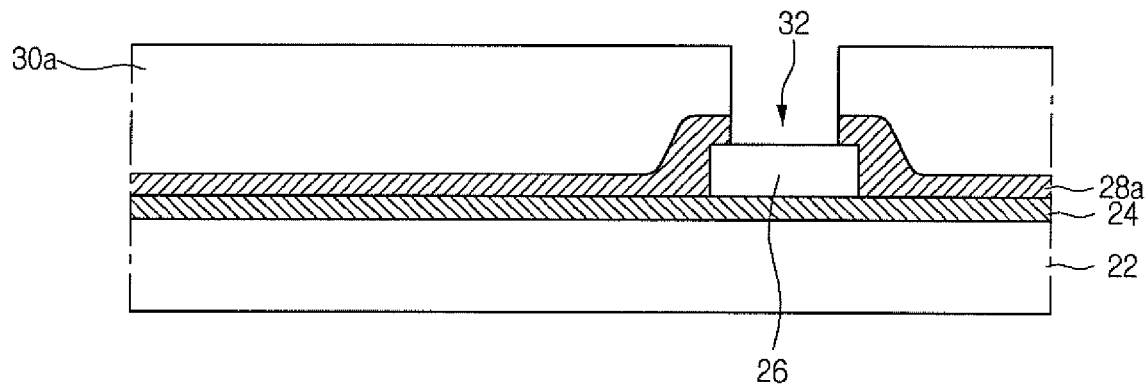

Referring to FIG. 2B, a first photosensitive layer can be formed on the passivation layer 28. The first photosensitive layer can be patterned by exposure and development processes such that a portion of the passivation layer 28 corresponding to the metal pad 26 is exposed, thereby forming a first photosensitive layer pattern 30a. Then, the passivation layer 28 can be selectively etched using the first photosensitive layer pattern 30a as a mask to form a pad opening 32 on the metal pad 26.

Figure 2C:
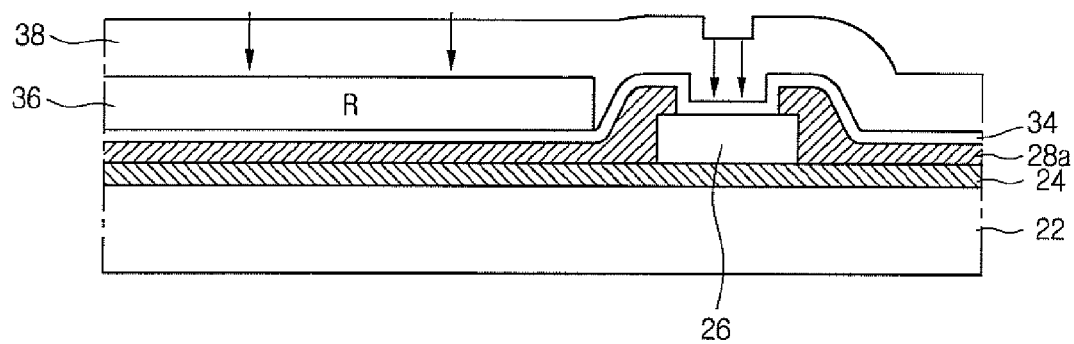

Referring to FIG. 2C, the first photosensitive layer pattern 30a can be removed. Then, a first planarization layer 34 can be deposited on an entire surface of the passivation layer 28a, and a red color filter layer 36 can be formed on the active region of the semiconductor substrate 22. A second photosensitive layer 38 can then be deposited on the semiconductor substrate 22.

Next, a second photosensitive layer pattern can be formed by removing a predetermined portion of the second photosensitive layer 38 using a dry ashing process. The dry ashing process can be performed using an end point detection (EPD) method to selectively remove the predetermined portion of the second photosensitive layer 38.

In other words, the predetermined portion of the second photosensitive layer 38 formed on the red color filter layer 36 and the second photosensitive layer 38 on the pad region can be removed to form the second photosensitive layer pattern 38a.

Also, in the dry ashing using the EPD method, the end point can be a surface of the first planarization layer 34 formed on the metal pad 26. That is, since the surface of the first planarization layer 34 is set as the end point, i.e., a target, the second photosensitive layer 38 does not remain on the metal pad 26.

Figure 2D:
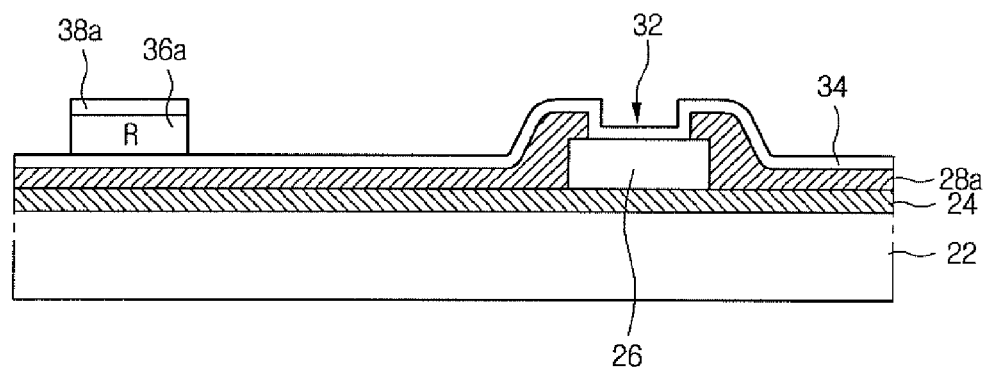

Referring to FIG. 2D, the second photosensitive layer 38 can be selectively removed as described above to form the second photoresist layer pattern 35a. Thereafter, the red color filter layer 36 can be selectively etched to form a red color filter 36a using the second photoresist layer pattern 38a as a mask.

Also, for the purpose of completely clearing the second photosensitive layer 38 that may exist on the metal pad 26 or the red color filter 36a, the dry ashing process may be re-performed on an entire surface of the semiconductor substrate 22 using $O_2$.

Figure 2E:
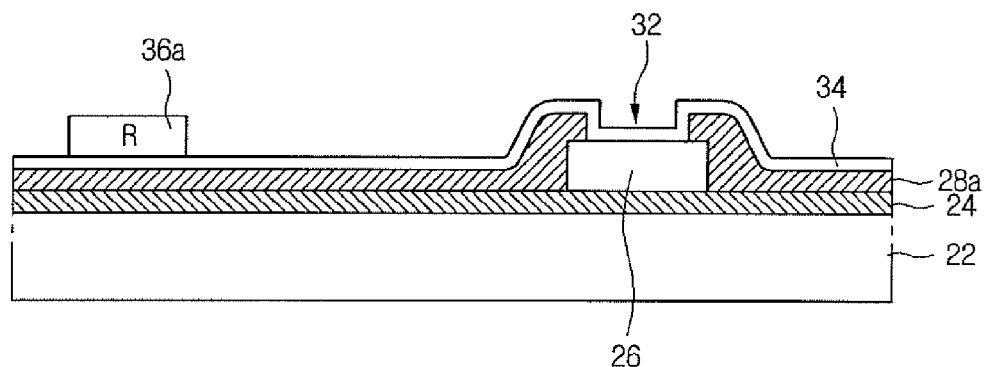

Referring to FIG. 2E, the second photosensitive layer pattern 38a on the red color filter 36a can be removed. Afterwards, the above-described processes of FIGS. 2C and 2D can be repeated for green and blue color filter layers to form green and blue color filters 40a and 42a.

Figure 2F:
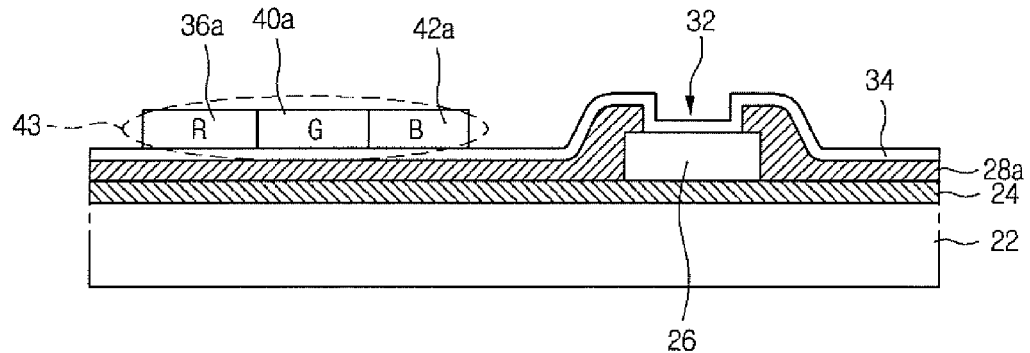

Referring to FIG. 2F, a color filter array 43 in which the red color filter 36a, the green color filter 40a and the blue color filter 42a are arranged in order is formed on an active region of the semiconductor substrate 22.

Here, since the photosensitive layers used for forming the respective color filters 36a, 40a and 42a are removed by the ashing process using the EPD method, the cross sections of the respective color filters 36a, 40a and 42a are planarized by the process of forming the respective color filters.

Figure 2G:
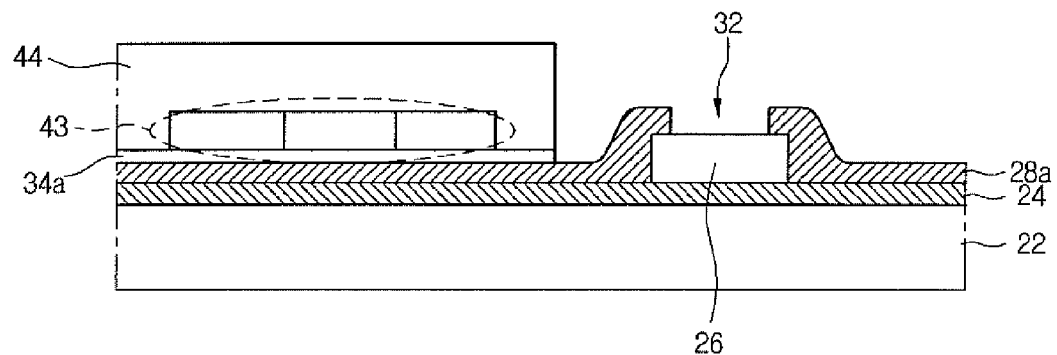

Referring to FIG. 2G, after a second planarization layer is formed on an entire surface of the semiconductor substrate 22 including the color filter array 43, the second planarization layer and the first planarization layer 34 can be removed in sequence to form a second planarization layer pattern 44 and a first planarization layer pattern 34a.

Figure 2H:
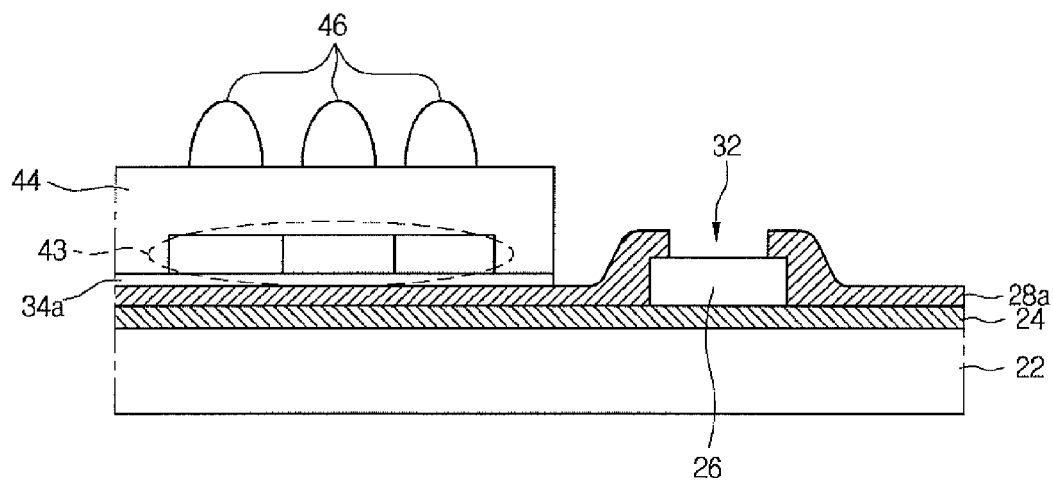

Referring to FIG. 2H, microlenses 46 can be formed on the second planarization layer pattern 44 such that they correspond to the respective color filters 36a, 40a and 42a. Afterwards, contact resistance can be checked through probe test of the respective metal pads 26 of an image sensor. If there is no problem, an external drive circuit can be connected to the metal pad electrically.

It should be understood that all the above embodiments is illustrative but not limited in all aspects of the present invention.

For example, in the embodiment of the present invention, it is mentioned that the first planarization layer pattern 34a is formed by partially removing the first planarization layer 34 after the second planarization layer pattern 44 is formed and it is then partially removed. However, as another embodiment, the first planarization layer 34 formed on the metal pad 26 can be removed immediately after formation of the first planarization layer 34, thereby forming the first planarization layer pattern 34a. In this case, an end point is the surface of the metal pad 22 in ashing process using the EPD method.

As described above, according to the present invention, the photosensitive layer for forming the respective color filters is removed using ashing process to completely remove the photosensitive layer remaining on the metal pad. As a result, the present invention has an effect of preventing the metal pad from being contaminated.

Also, according to the present invention, it is possible to planarize cross section of each color filter by accurately controlling the EDP method. As a result, embodiments of the present invention has another effect of preventing an undesirable beam from flowing into a photodiode.

It will be apparent to those skilled in the art that various modifications and variations can be made in the present invention. Thus, it is intended that the present invention covers the modifications and variations of this invention provided they come within the scope of the appended claims and their equivalent.

I claim:

1. A method for manufacturing an image sensor, comprising:
    forming a metal pad on a pad region of a semiconductor substrate having an active region and the pad region;
    forming a metal pad opening by forming a passivation layer on an entire surface of the semiconductor substrate including the metal pad and selectively removing the passivation layer to expose the metal pad;
    forming a color filter array on the passivation layer of the active region by removing a predetermined portion of a photosensitive layer used for forming the color filter array through an ashing process using an end point detection method; and
    forming a microlens on the color filter layer.

2. The method according to claim 1, wherein the color filter array comprises a red color filter, a green color filter and a blue color filter.

3. The method according to claim 1, wherein forming the color filter array comprises:
    forming a color filter layer on the passivation layer in the active region;
    forming a photosensitive layer pattern by depositing a photosensitive layer on an entire surface of the semiconductor substrate including the color filter layer, and removing the predetermined portion of the photosensitive layer through the ashing process using the end point detection method; and
    selectively etching the color filter layer using the photosensitive layer pattern as a mask to form a color filter, and removing the photosensitive layer pattern.

4. The method according to claim 3, further comprising performing an ashing process on an entire surface of the semiconductor substrate using $O_2$.

5. The method according to claim 3, wherein removing the predetermined portion of the photosensitive layer comprises removing a portion of the photosensitive layer formed on the color filter layer and the photosensitive layer formed on the pad region.

6. The method according to claim 1, wherein the end point is a surface of the metal pad.

7. The method according to claim 1, further comprising forming an insulating layer between the semiconductor substrate and the metal pad.

8. The method according to claim 1, wherein the metal pad is formed of aluminum.

9. A method for manufacturing an image sensor, comprising:
    forming a metal pad on a pad region of a semiconductor substrate having an active region and the pad region;
    forming a metal pad opening by forming a passivation layer on an entire surface of the semiconductor substrate including the metal pad and selectively removing the passivation layer to expose the metal pad;
    forming a first planarization layer on the passivation layer;
    forming a color filter array on the first planarization layer of the active region by removing a predetermined portion of a photosensitive layer used for forming the color filter array through an ashing process using an end point detection method;
    removing the first planarization layer on the pad region; and
    forming a microlens on the color filter array.

10. The method according to claim 9, wherein the color filter array comprises a red color filter, a green color filter and a blue color filter.

11. The method according to claim 9, wherein forming the color filter array comprises:
    forming a color filter layer on the first planarization layer in the active region;
    forming a photosensitive layer pattern by depositing a photosensitive layer on an entire surface of the semiconductor substrate including the color filter layer, and removing the predetermined portion of the photosensitive layer through the ashing process using the end point detection method; and
    selectively etching the color filter layer using the photosensitive layer pattern as a mask to form a color filter, and removing the photosensitive layer pattern.

12. The method according to claim 11, further comprising performing an ashing process on an entire surface of the semiconductor substrate using $O_2$.

13. The method according to claim 11, wherein removing the predetermined portion of the photosensitive layer comprises removing a portion of the photosensitive layer formed on the color filter layer and the photosensitive layer formed on the pad region.

14. The method according to claim 9, further comprising forming an insulating layer between the semiconductor substrate and the metal pad.

15. The method according to claim 9, wherein the metal pad is formed of aluminum.

16. A method for manufacturing an image sensor, comprising:
    forming a metal pad on a pad region of a semiconductor substrate having an active region and the pad region;
    forming a metal pad opening by forming a passivation layer on an entire surface of the semiconductor substrate including the metal pad and selectively removing the passivation layer to expose the metal pad;
    forming a first planarization layer on the passivation layer;
    forming a color filter array on the first planarization layer of the active region by removing a predetermined portion of a photosensitive layer used for forming the color filter array through an ashing process using an end point detection method;
    forming a second planarization layer on an entire surface of the semiconductor substrate including the color filter array;
    removing the first and second planarization layers on the pad region; and
    forming a microlens on the color filter layer.

17. The method according to claim 16, wherein the end point is a surface of the first planarization layer.

18. The method according to claim 16, wherein forming the color filter array comprises:
    forming a color filter layer on the first planarization layer in the active region;
    forming a photosensitive layer pattern by depositing a photosensitive layer on an entire surface of the semiconductor substrate including the color filter layer, and removing the predetermined portion of the photosensitive layer through the ashing process using the end point detection method; and
    selectively etching the color filter layer using the photosensitive layer pattern as a mask to form a color filter, and removing the photosensitive layer pattern.

19. The method according to claim 18, further comprising performing an ashing process on an entire surface of the semiconductor substrate using $O_2$.

20. The method according to claim 18, wherein removing the predetermined portion of the photosensitive layer comprises removing a portion of the photosensitive layer formed on the color filter layer and the photosensitive layer formed on the pad region.

* * * * *